(12) United States Patent
Sugiura et al.

(10) Patent No.: US 10,619,231 B2
(45) Date of Patent: Apr. 14, 2020

(54) RADIATING FIN FORMED OF ALUMINUM ALLOY AND METHOD FOR PRODUCING THE SAME

(71) Applicant: Asanuma Giken Co., Ltd., Hamamatsu-shi (JP)

(72) Inventors: Yasuo Sugiura, Hamamatsu (JP); Yoshinori Kamikubo, Hamamatsu (JP); Masashi Takahashi, Hamamatsu (JP); Kensuke Yamamoto, Hamamatsu (JP)

(73) Assignee: Asanuma Giken Co., Ltd., Hamamatsu-shi (JP)

( * ) Notice: Subject to any disclaimer, the term of this patent is extended or adjusted under 35 U.S.C. 154(b) by 460 days.

(21) Appl. No.: 15/341,312

(22) Filed: Nov. 2, 2016

(65) Prior Publication Data

US 2017/0073801 A1 Mar. 16, 2017

Related U.S. Application Data

(63) Continuation of application No. PCT/JP2015/063000, filed on Apr. 30, 2015.

(30) Foreign Application Priority Data

May 2, 2014 (JP) ................................. 2014-095110

(51) Int. Cl.
*C22F 1/00* (2006.01)
*C22F 1/043* (2006.01)
(Continued)

(52) U.S. Cl.
CPC .............. *C22F 1/043* (2013.01); *B22D 17/00* (2013.01); *B22D 21/007* (2013.01); *B22D 25/02* (2013.01);
(Continued)

(58) Field of Classification Search
CPC ................. F28F 21/084; F28F 2225/06; F28F 2255/143; C22C 21/02; C22C 21/04; C22C 1/005
See application file for complete search history.

(56) References Cited

U.S. PATENT DOCUMENTS

| | | | | |
|---|---|---|---|---|
| 5,394,931 | A | * | 3/1995 | Shiina ................. B22D 17/007 164/113 |
| 6,059,902 | A | * | 5/2000 | Yoshihara ............... C22C 21/02 148/417 |
| 2002/0148325 | A1 | * | 10/2002 | Bergsma .............. B22D 17/007 74/593 |

FOREIGN PATENT DOCUMENTS

| | | |
|---|---|---|
| JP | 2005-272966 | 10/2005 |
| JP | 2006-037190 | 2/2006 |

(Continued)

OTHER PUBLICATIONS

Patel, Rheo-processing of an alloy specifically designed for semi-solid metal processing based on the Al—Mg—Si system, 2008, Materials Science and Engineering A.*

*Primary Examiner* — Eric S Ruppert
(74) *Attorney, Agent, or Firm* — Harness, Dickey & Pierce, P.L.C.

(57) ABSTRACT

An aluminum alloy has high thermal conductivity without requiring an addition of metal elements such as iron and a method for producing the aluminum alloy. The aluminum alloy is obtained from a semi-solid material with a chemical composition containing 2 to 6 wt % of silicon (Si) and 0.7 wt % or less of magnesium (Mg), with the balance being aluminum (Al) and unavoidable impurities. It has a granular crystalline structure. The aluminum alloy is produced by a heating step of semi-solid material. A forming step is performed with semi-solid material obtained in the heating step (Continued)

S1. After the forming step, a heat treatment step is performed at 190° C. to 290° C. for 1 to 5 hours.

2 Claims, 3 Drawing Sheets

(51) Int. Cl.
*B22D 17/00* (2006.01)
*C22C 21/02* (2006.01)
*H01L 23/373* (2006.01)
*B22D 21/00* (2006.01)
*B22D 25/02* (2006.01)
*F28F 21/08* (2006.01)

(52) U.S. Cl.
CPC ............ *C22C 21/02* (2013.01); *F28F 21/084* (2013.01); *H01L 23/373* (2013.01); *C22F 1/00* (2013.01); *F28F 2225/06* (2013.01); *F28F 2255/143* (2013.01); *H01L 2924/0002* (2013.01)

(56) References Cited

FOREIGN PATENT DOCUMENTS

| | | |
|---|---|---|
| JP | 2006-063420 | 3/2006 |
| WO | WO2011-158477 | 12/2011 |

\* cited by examiner

[ Fig 1 ]
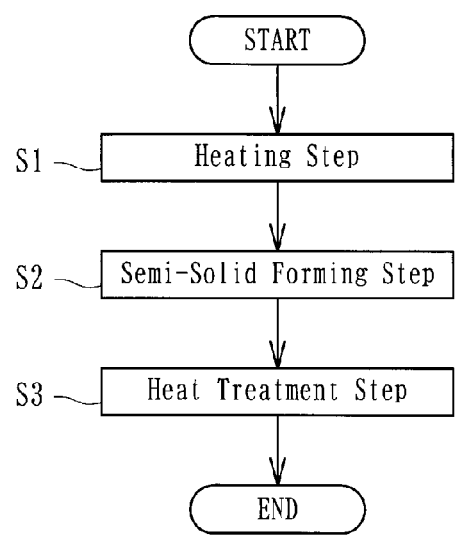

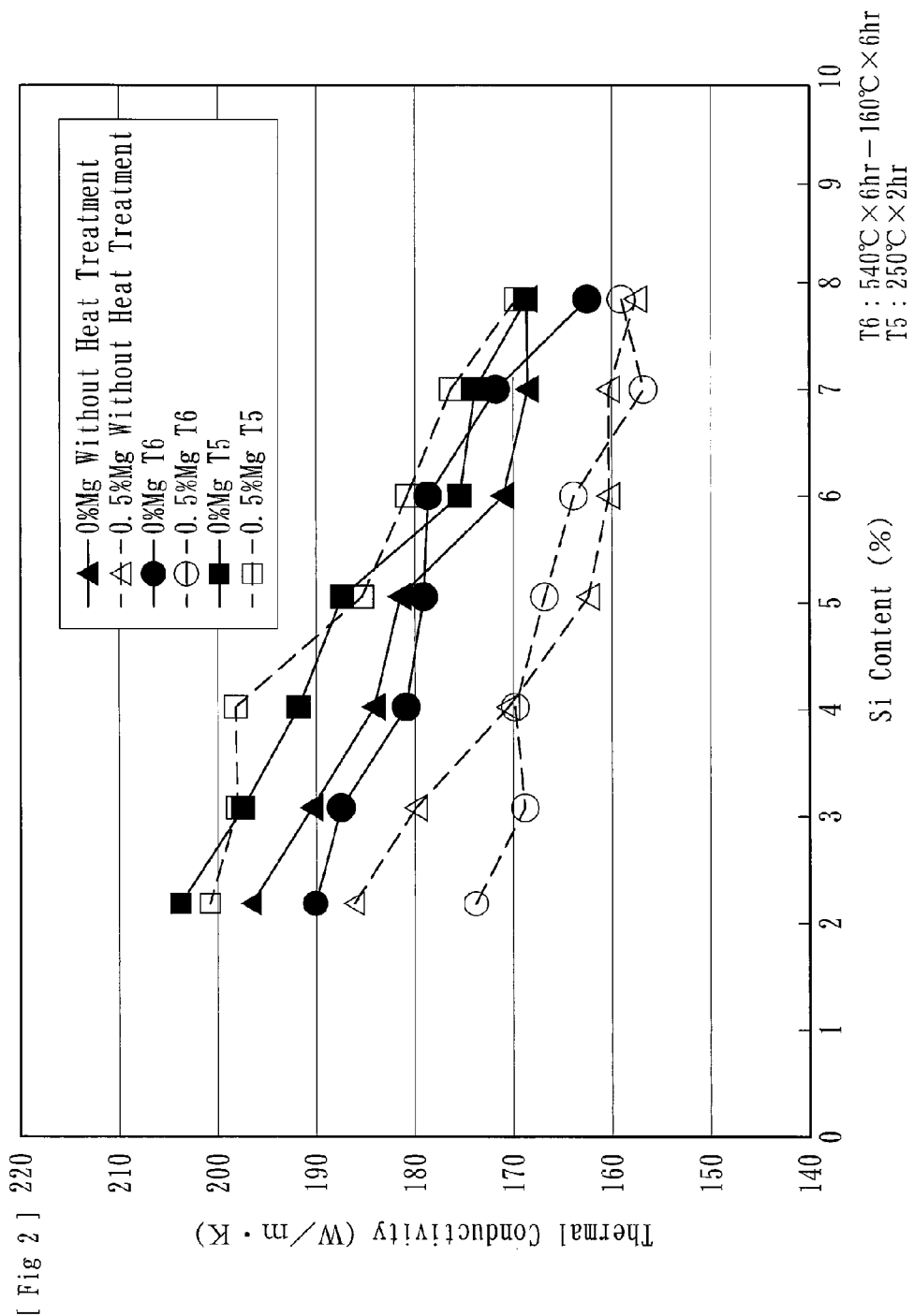

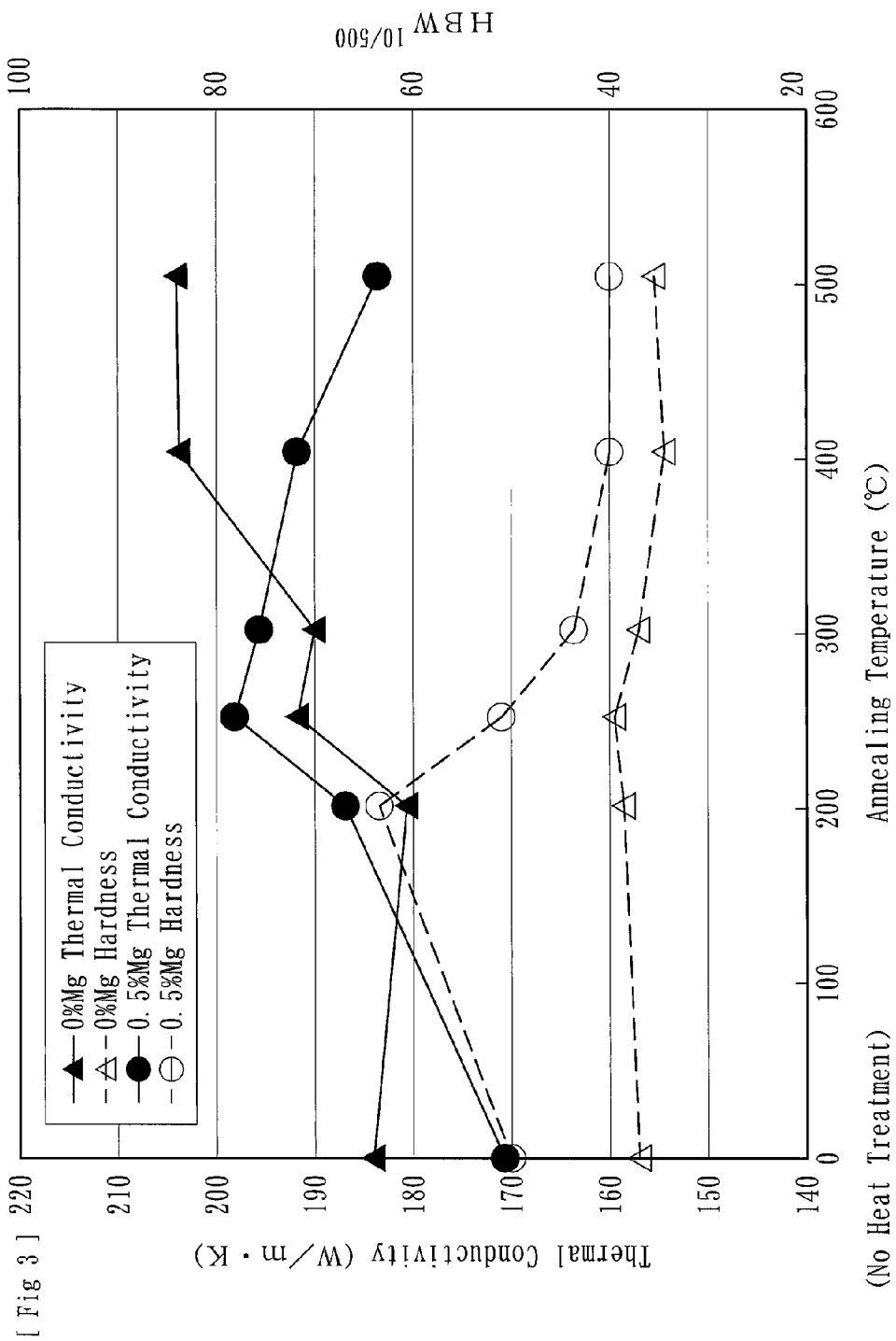
[Fig 3]

RADIATING FIN FORMED OF ALUMINUM ALLOY AND METHOD FOR PRODUCING THE SAME

CROSS-REFERENCE TO RELATED APPLICATIONS

This application is a continuation of International Application No. PCT/JP2015/063000, filed Apr. 30, 2015, which claims priority to Japanese Application No. 2014-095110, filed May 2, 2014. The disclosures of the above applications are incorporating herein by reference.

FIELD

The present disclosure relates to a production method and a radiating fin formed from an aluminum alloy. The fin has high thermal conductivity and high strength.

BACKGROUND

In next-generation vehicles, such as hybrid vehicles and electric vehicles, the heat generation density increases with the increase of the output of and decrease of the size of storage batteries and power devices. Thus, measures need to be taken against radiation of the generated heat. In addition to the next-generation vehicles, the same problem arises in transporters such as airplanes, LED luminaires, personal computers, household electric appliances, such as refrigerators, and any other devices that require electric power.

Due to such recent circumstances, it has become important to improve heat radiation performance of heat sinks and the like. In general, copper or aluminum is used as a metal heat radiation material for heat sinks. Extrusion or forging is employed as a production method. However, the improvement in performance by elaborate heat sink fin designs, that have been carried out so far, have substantially reached their limit from the viewpoint of, for example, workability and thermal resistance. Furthermore, extrusion and forging have a low degree of freedom in shape due to problems attributable to their production methods and also their required high cost. This makes it difficult to employ extrusion and forging methods.

Accordingly, various materials have been proposed that are used for heat sink fins. The materials have high thermal conductivity and thus produce an excellent heat-radiating effect. For example, as disclosed in Japanese Unexamined Patent Application Publication No. 2006-63420, an aluminum alloy is proposed with high strength and high thermal conductivity. It is obtained by die casting a material containing silicon (Si), magnesium (Mg), iron (Fe), and boron (B) as additives, with the balance being aluminum (Al) and unavoidable impurities. Aging heat treatment is then performed.

SUMMARY

In the above related art, however, a die casting method is required. This poses a problem where the thermal conductivity cannot be sufficiently improved. That is, a die casting method is a production method where molten metal is injected into a mold at high speed and high pressure. Inclusion of air and oxides often occurs. Thus, many minute defects, called microporosity, are formed. The defects cause a decrease in the thermal conductivity. Thus, the actual thermal conductivity of die-cast products is much lower than the nominal value. The addition of metal elements such as iron (Fe) is required to prevent seizure of aluminum onto a die. However, if an alloy is formed while metal elements, such as iron (Fe), are contained in the aluminum, the thermal conductivity decreases in proportion to the amount of the alloy components. If the amount of alloy components is decreased in a die casting method, the castability degrades. This increases the fraction defects and decreases the yield.

In view of the foregoing, it is an object of the present disclosure to provide a radiating fin formed of an aluminum alloy that does not require addition of metal elements such as iron. It has high formability and high thermal conductivity can be achieved. A method is also provided for producing the radiating fin.

A radiating fin is formed from an aluminum alloy obtained by injecting a semi-solid material into a mold at a speed of 0.15 to 0.4 (m/s) and a pressure of 15 to 30 (MPa). This performs semi-solid forming. Heat treatment is performed at 190° C. to 290° C. for 1 to 5 hours. The semi-solid material has a chemical composition containing 2 to 6 wt % of silicon (Si) and 0.7 wt % or less of magnesium (Mg), with the balance being aluminum (Al) and unavoidable impurities. The semi-solid material contains only silicon (Si) and magnesium (Mg) as additives and has a granular crystalline structure.

A method for producing a radiating fin formed of an aluminum alloy includes injecting a semi-solid material into a mold at a speed of 0.15 to 0.4 (m/s) and a pressure of 15 to 30 (MPa). This performs semi-solid forming. Heat treatment at 190° C. to 290° C. for 1 to 5 hours is then performed. The semi-solid material has a chemical composition containing 2 to 6 wt % of silicon (Si) and 0.7 wt % or less of magnesium (Mg). The balance is aluminum (Al) and unavoidable impurities. The semi-solid material only contains silicon (Si) and magnesium (Mg) as additives and has a granular crystalline structure.

A semi-solid material has a granular crystalline structure. Therefore, good fluidity can be achieved when the material is injected into a mold during forming. Even if the material is injected into the mold at low temperature, low speed, and low pressure, the mold can be satisfactorily filled with the material. This eliminates the need for adding metal elements, such as iron. Additionally, high thermal conductivity is provided. As a result, strength and thermal conductivity do not decrease as occurs in actual die-cast products.

Thermal conductivity can be improved due to the semi-solid material subjected to semi-solid forming and heat-treated at 190° C. to 290° C. for 1 to 5 hours. Thus, the thermal conductivity is improved without adding metal elements, such as iron.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a flowchart illustrating a production process of an aluminum alloy.

FIG. 2 is a graph illustrating thermal conductivity plotted against silicon (Si) content in Examples and Comparative Examples.

FIG. 3 is a graph illustrating thermal conductivity and hardness plotted against annealing temperature in Examples and Comparative Examples.

DETAILED DESCRIPTION

Hereafter, embodiments of the present disclosure will be specifically described with reference to the attached drawings.

An aluminum alloy according to this embodiment is obtained from a semi-solid material that has a chemical composition containing 2 to 6 wt % of silicon (Si) and 0.7 wt % or less of magnesium (Mg). The balance is aluminum (Al) and unavoidable impurities. The material has a granular crystalline structure to improve formability. The aluminum alloy has a thermal conductivity of 180 W (m·K) or more.

The aluminum alloy is preferably obtained by performing semi-solid forming on a semi-solid material. The material has a chemical composition containing 2 to 6 wt % of silicon (Si) and 0.7 wt % or less of magnesium (Mg). The balance is aluminum (Al) and unavoidable impurities. The materials have a granular crystalline structure. Heat treatment at 190° C. to 290° C. for 1 to 5 hours is then performed. The semi-solid material is preferably a material that contains only silicon (Si) and magnesium (Mg) as additives. The material does not contain and is devoid of iron (Fe). From a practical viewpoint for cost reasons or the like or the requirement of strength or the like, the semi-solid material may be a material that does not contain magnesium (Mg) or a material that contains iron (Fe) as an unavoidable impurity as long as the thermal conductivity does not decrease.

Pure aluminum has the highest thermal conductivity. The thermal conductivity of aluminum decreases proportionately as amounts of added elements increase. However, pure aluminum has low strength. Additionally, pure aluminum does not have a solid-liquid coexisting region for semi-solid forming. Thus, it is impossible to perform semi-solid forming with pure aluminum. Therefore, in order to improve the thermal conductivity while achieving high strength, the amount of added elements need to be decreased as much as possible. This creates a condition in the material where semi-solid forming can be performed.

Accordingly, the added additive (element) to pure aluminum in this embodiment is at least silicon (Si). When magnesium (Mg) is added, the amount of magnesium added is 0.7 wt % or less. Addition of magnesium (Mg) is not necessarily required. However, the addition of magnesium (Mg) can improve the strength of a formed article. Silicon (Si) is required to provide a solid-liquid coexisting state during heating. This enables semi-solid forming. Also, it improves the fluidity of molten metal for a mold. Magnesium (Mg) is required to improve the strength of the formed article. Thus, there is no need for adding iron (Fe). Iron (Fe) has been required for conventional die casting alloys. The reason for this is as follows. Iron (Fe) added to die casting alloys is required to prevent seizure of aluminum onto a die. However, when semi-solid forming is employed, as in this embodiment, there is no need for adding iron (Fe). This is due to the casting temperature being about 100° C. lower than that in a conventional die casting method. Thus, a semi-solid material can be injected at low speed and low pressure.

The semi-solid material includes both a material obtained by melting metal to a solid-liquid coexisting state (thixocasting) and a material obtained by cooling molten metal to a solid-liquid coexisting state (rheocasting). Here, the semi-solid material includes both forms (semi-solid). In such a forming method that uses a semi-solid material (semi-solid forming method), the cooling rate during forming is high. Thus, fine-grained crystals are formed. Accordingly, a high-strength formed article is produced. This improves the mechanical properties of the material. Furthermore, a uniform structure is formed at low pressure. Thus, formation of shrinkage holes and segregation hardly occur. This provides a high-quality formed article with actual strength that does not decrease.

The semi-solid material according to this embodiment is obtained by, for example, a method for mechanically or electromagnetically stirring molten metal, a method for performing granulation during recrystallization by imparting strains, or a method using solidification control. The semi-solid material includes a granular primary crystal. When the semi-solid material is formed, forming is caused from a solid-liquid coexisting region. The coexisting region increases the cooling rate and thus improves the mechanical properties of products. Furthermore, the semi-solid material includes a granular primary crystal. Thus, semi-solid material has better fluidity than molten metal. Even if the semi-solid material is injected at low speed and low pressure, a mold can be satisfactorily filled with the semi-solid material. That is, by using a semi-solid material with good fluidity, formed articles with complicated shapes and with thin-walls can be produced with high precision.

The semi-solid forming may be performed using any material having a semi-solid state. Therefore, a variety of materials can be used. Such material is ones having high thermal conductivity. The semi-solid forming method includes perforating heat treatment. This achieves low microporosity. Thus, the thermal conductivity can be further improved. Accordingly, by injecting the semi-solid material into a mold at low speed and low pressure, an aluminum alloy can be satisfactorily produced in the mold.

The thermal conductivity and strength are improved in the aluminum alloy according to this embodiment by performing heat treatment after the semi-solid forming. The heat treatment temperature is 190° C. to 290° C. The heat treatment time is 1 to 5 hours. As a result of the heat treatment, the solubility of silicon (Si) in a primary α-Al phase decreases. This increases the concentration of aluminum (Al) and thus improves the thermal conductivity. A heat treatment temperature of lower than 190° C. or a heat treatment time of less than 1 hour causes insufficient heat treatment. Thus, high strength is not achieved. A heat treatment temperature of higher than 290° C. causes overaging. This decreases strength. A heat treatment time of more than 5 hours decreases strength and degrades the productivity.

The amounts of components other than silicon (Si) and magnesium (Mg) need to be decreased as much as possible in order to improve thermal conductivity. However, this increases cost. Therefore, the inclusion of impurities, unavoidable impurities, is permissible. For example, as long as the thermal conductivity is not less than 180 W/(m·K) impurities are tolerable. Examples of the unavoidable impurities include copper (Cu), zinc (Zn), iron (Fe), manganese (Mn), nickel (Ni), titanium (Ti), lead (Pb), tin (Sn), and chromium (Cr). However, if a secondary ingot is used for the semi-solid materials, it is difficult to decrease the iron (Fe) content. Thus, 0.3% or less of iron (Fe) may be contained. Manganese (Mn) and titanium (Ti) considerably decrease the thermal conductivity. Thus, 0.05% or less of manganese (Mn) or titanium (Ti) may be contained. Other elements may each be contained in an amount of 0.1% or less.

A production process of an aluminum alloy according to this embodiment will be described with reference to the flowchart in FIG. 1.

The aluminum alloy according to this embodiment includes a heating step S1, a semi-solid forming step S2, and a heat treatment step S3. The steps S1-S3 are conducted in sequence. The heating step S1 comprises heating an alloy under particular conditions. The alloy includes adding silicon (Si) and magnesium (Mg) to aluminum to obtain a semi-solid material with a granular crystalline structure. The alloy has a chemical composition including 2 to 6 wt % of silicon (Si) and 0.7 wt % or less, preferably 0.2 to 0.7 wt %, of magnesium (Mg), with the balance being aluminum (Al) and unavoidable impurities.

The semi-solid forming step S2 comprises semi-solid forming of the semi-solid material obtained in the heating step (S1). The semi-solid material is injected into a desired mold at low speed and low pressure. It is injected into a mold at a speed of 0.15 to 0.4 (m/s) and a pressure of 15 to 30 (MPa). The heat treatment step (S3) comprises heat treatment on the formed article obtained in the semi-solid forming step (S2). The heat treatment is performed at 190° C. to 290° C. for 1 to 5 hours.

The technical advantages of the present disclosure will be described based on Examples and Comparative Examples.

An aluminum alloy with a composition listed in Table 1 below was heated and then poured into a particular container. Solidification control was performed so that a granular primary α-Al phase is obtained, thereby producing a billet. The produced billet was reheated to a semi-solid state and subjected to pressure forming, semi-solid forming, into a disc shape. Articles with 0.5% of magnesium (Mg) added during dissolution were formed. Also, formed articles with no magnesium (Mg) were produced.

TABLE 1

| Name of alloy | Cu | Si | Mg | Zn | Fe | Mn | Ni | Sn | Ti | Pb | Cr | Sr | Al |
| --- | --- | --- | --- | --- | --- | --- | --- | --- | --- | --- | --- | --- | --- |
| Al—2%Si | 0.000 | 2.183 | 0.002 | 0.007 | 0.138 | 0.003 | 0.003 | 0.001 | 0.005 | 0.0012 | 0.0004 | 0.0003 | Bal. |
| Al—3%Si | 0.000 | 3.104 | 0.002 | 0.007 | 0.128 | 0.003 | 0.002 | 0.001 | 0.006 | 0.0012 | 0.0006 | 0.0003 | Bal. |
| Al—4%Si No. 1 | 0.000 | 4.020 | 0.003 | 0.010 | 0.137 | 0.004 | 0.004 | 0.002 | 0.009 | 0.0020 | 0.0010 | 0.0004 | Bal. |
| Al—5%Si | 0.000 | 5.079 | 0.002 | 0.007 | 0.146 | 0.003 | 0.003 | 0.000 | 0.009 | 0.0008 | 0.0010 | 0.0003 | Bal. |
| Al—6%Si | 0.000 | 6.013 | 0.005 | 0.006 | 0.132 | 0.003 | 0.002 | 0.000 | 0.009 | 0.0006 | 0.0012 | 0.0003 | Bal. |
| Al—7%Si | 0.000 | 6.996 | 0.005 | 0.008 | 0.144 | 0.003 | 0.003 | 0.000 | 0.010 | 0.0008 | 0.0014 | 0.0003 | Bal. |
| Al—8%Si | 0.000 | 7.873 | 0.004 | 0.003 | 0.140 | 0.003 | 0.013 | 0.003 | 0.013 | 0.0004 | 0.0015 | 0.0000 | Bal. |

The disc-shaped formed articles were subjected to the following treatments: no heat treatment; heat treatment at 540° C. for 6 hours; heat treatment at 160° C. for 6 hours (T6); and heat treatment at 250° C. for 2 hours (T5). The thermal conductivity (W/(m·K)) and Brinell hardness (HBW) of the resulting formed articles were measured. Table 2 below and FIG. 2 show the results. The formed articles with silicon (Si) contents of 7% and 8% correspond to Comparative Examples.

TABLE 2

| | | 0% Mg | | 0.5% Mg | |
| --- | --- | --- | --- | --- | --- |
| Name of alloy | Heat treatment | Thermal conductivity W/(m · K) | Brinell hardness HBW | Thermal conductivity W/(m · K) | Brinell hardness HBW |
| Al—2% Si | - | 197 | 28 | 186 | 44 |
| | T6 | 190 | 34 | 174 | 104 |
| | T5 | 204 | 29 | 201 | 52 |
| Al—3% Si | - | 190 | 35 | 179 | 47 |
| | T6 | 188 | 35 | 169 | 109 |
| | T5 | 197 | 34 | 198 | 52 |
| Al—4% Si | - | 164 | 37 | 171 | 50 |
| | T6 | 181 | 38 | 170 | 108 |
| | T5 | 192 | 40 | 198 | 51 |
| Al—5% Si | - | 182 | 42 | 162 | 57 |
| | T6 | 179 | 38 | 167 | 110 |
| | T5 | 187 | 43 | 185 | 64 |
| Al—6% Si | - | 171 | 46 | 161 | 61 |
| | T6 | 179 | 38 | 164 | 109 |
| | T5 | 176 | 44 | 181 | 65 |
| Al—7% Si | - | 169 | 47 | 161 | 66 |
| | T6 | 172 | 38 | 157 | 111 |
| | T5 | 174 | 49 | 177 | 66 |
| Al—8% Si | - | 169 | 51 | 158 | 70 |
| | T6 | 163 | 41 | 159 | 110 |
| | T5 | 169 | 51 | 170 | 66 |

Heat treatment T6: 540° C. × 6 hr-160° C. × 6 hr T5: 250° C. × 2 hr

As is clear from FIG. 2 and Table 2 above, thermal conductivity increases as the silicon (Si) content decreases. The addition of magnesium (Mg) exhibits a heat treatment effect and improves hardness. Thus, in the case where a formed article is obtained through a known die casting method, the melting temperature increases as the silicon (Si) content decreases. The addition of magnesium (Mg) decreases the fluidity of the molten metal. In contrast, in the case where a formed article is obtained through a semi-solid forming method as in the present disclosure, good fluidity of the molten metal is achieved due to a granular primary α-Al phase. Thus, forming can be satisfactorily performed.

The heat treatment of T6 (heat treatment at 540° C. for 6 hours and heat treatment at 160° C. for 6 hours) includes a solution treatment. As is clear from Table 2, the heat treatment of T6 is necessary for improving the strength. However, the formed article is held at high temperatures and then quenched. Therefore, impurities in the structure are trapped in the aluminum in a dissolved manner. This decreases thermal conductivity. Accordingly, the heat treatment of T5 (heat treatment at 250° C. for 2 hours) (i.e., annealing) is performed.

FIG. 3 shows the experimental results of the influence of annealing temperature on thermal conductivity and hardness in the formed article containing 4% silicon (Si). It is clear from the experimental results that the Example where the silicon (Si) content is 4% and the magnesium (Mg) content is 0.5%, that the annealing temperature is preferably set to 190° C. to 290° C. This improves the thermal conductivity while achieving a certain degree of hardness.

The embodiments of the present disclosure have been described so far. However, the present disclosure is not limited to that disclosure. Products obtained through semi-solid forming are applicable to radiating fins. The fins have high thermal conductivity (180 W/(m·K) or more, as in this embodiment, and produce a good heat-radiating effect.

A radiating fin is formed by semi-solid forming of an aluminum alloy. The fin is obtained by injecting a semi-solid material into a mold at a speed of 0.15 to 0.4 (m/s) and a pressure of 15 to 30 (MPa). Heat treatment at 190° C. to 290° C. for 1 to 5 hours is performed on the fin. The semi-solid material has a chemical composition comprising 2 to 6 wt % of silicon (Si), 0.7 wt % or less of magnesium (Mg), with the balance being aluminum (Al) and unavoidable impurities. The alloy contains only silicon (Si) and magnesium (Mg) as additives. The alloy has a granular crystalline structure. A method for producing the radiating fin is disclosed and other embodiments may also be employed.

The present disclosure has been described with reference to the preferred embodiment. Obviously, modifications and alternations will occur to those of ordinary skill in the art upon reading and understanding the preceding detailed description. It is intended that the present disclosure be construed to include all such alternations and modifications insofar as they come within the scope of the appended claims or their equivalents.

What is claimed is:

1. A radiating fin obtained by injecting a semi-solid material into a mold to perform semi-solid forming at a speed of 0.15 to 0.4 (m/s) and a pressure of 15 to 30 (MPa) and heat treating at 190° C. to 290° C. for 1 to 5 hours, and the fin comprising an aluminum alloy material with a chemical composition containing 2 to 6 wt % of silicon (Si) and 0.7 wt % or less of magnesium (Mg), and the balance being aluminum (Al) devoid of iron and unavoidable impurities with no additional iron other than what may occur as an unavoidable impurity, the material contains only silicon (Si) and magnesium (Mg) as additives and the fin has a granular crystalline structure.

2. A radiating fin of claim 1 further comprising a thermal conductivity greater than or equal to 180 W/(m·k).

* * * * *